United States Patent
Gong et al.

(10) Patent No.: US 11,387,428 B2
(45) Date of Patent: Jul. 12, 2022

(54) ORGANIC ELECTROLUMINESCENT DISPLAY PANEL INCLUDING SELECTIVELY OXIDIZED PROTECTION LAYER AND METHOD FOR MANUFACTURING THE SAME

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Kui Gong, Beijing (CN); Xianxue Duan, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 947 days.

(21) Appl. No.: 16/080,908

(22) PCT Filed: Feb. 13, 2018

(86) PCT No.: PCT/CN2018/076640
§ 371 (c)(1),
(2) Date: Aug. 29, 2018

(87) PCT Pub. No.: WO2018/223731
PCT Pub. Date: Dec. 13, 2018

(65) Prior Publication Data
US 2021/0184164 A1 Jun. 17, 2021

(30) Foreign Application Priority Data
Jun. 9, 2017 (CN) .......................... 201710434068.4

(51) Int. Cl.
*H01L 51/52* (2006.01)
*H01L 51/56* (2006.01)
*H01L 27/32* (2006.01)

(52) U.S. Cl.
CPC .......... *H01L 51/5253* (2013.01); *H01L 51/56* (2013.01); *H01L 27/3276* (2013.01)

(58) Field of Classification Search
CPC . H01L 51/5253; H01L 51/56; H01L 51/5012; H01L 27/3246; H01L 27/3272
See application file for complete search history.

(56) References Cited

U.S. PATENT DOCUMENTS 7,265,391 B2   9/2007  Yamazaki et al.
8,766,306 B2   7/2014  Lifka et al.
(Continued)

FOREIGN PATENT DOCUMENTS

CN   1434668 A    8/2003
CN   102934252 A  2/2013
(Continued)

OTHER PUBLICATIONS

First Office Action dated Jun. 4, 2019; Corresponding to Chinese Application No. 201710434068 4; English Translation Attached.
(Continued)

*Primary Examiner* — Matthew E. Gordon
(74) *Attorney, Agent, or Firm* — Nath, Goldberg & Meyer; Joshua B. Goldberg (57) ABSTRACT

An organic electroluminescent display panel includes: a first electrode, a pixel defining layer, an organic light emitting functional layer and a second electrode provided on a substrate; a conductive layer and a protection layer provided at a side of the second electrode away from the substrate, the conductive layer and the protection layer being provided in a single layer, a surface of the protection layer away from the
(Continued)

substrate being parallel to that of the second electrode away from the substrate, the conductive layer being provided between the protection layer and the second electrode and in contact with the second electrode, the protection layer including a first portion provided in the pixel regions and a second portion provided on the conductive layer, and a sum of a thickness of the second portion and a thickness of the conductive layer being approximately equal to a thickness of the first portion.

9 Claims, 6 Drawing Sheets

(56) References Cited

U.S. PATENT DOCUMENTS

| | | | |
|---|---|---|---|
| 9,627,459 | B2 | 4/2017 | Yamazaki et al. |
| 10,205,121 | B2 | 2/2019 | Song et al. |
| 2003/0137325 | A1* | 7/2003 | Yamazaki ........... H01L 27/3246 327/80 |
| 2011/0127562 | A1 | 6/2011 | Sung et al. |
| 2013/0092914 | A1* | 4/2013 | Lifka .................. H01L 51/5206 257/40 |
| 2017/0117500 | A1 | 4/2017 | Gunji |
| 2018/0182869 | A1* | 6/2018 | Liu .................. H01L 29/78603 |

FOREIGN PATENT DOCUMENTS

| | | |
|---|---|---|
| CN | 104022139 A | 9/2014 |
| CN | 106024638 A | 10/2016 |
| CN | 106611772 A | 5/2017 |
| CN | 107256878 A | 10/2017 |

OTHER PUBLICATIONS

International Search Report dated May 14, 2018 issued in corresponding International Application No. PCT/CN2018/076640.

* cited by examiner

ORGANIC ELECTROLUMINESCENT DISPLAY PANEL INCLUDING SELECTIVELY OXIDIZED PROTECTION LAYER AND METHOD FOR MANUFACTURING THE SAME

CROSS-REFERENCE TO RELATED APPLICATIONS

This is a National Phase Application filed under 35 U.S.C. 371 as a national stage of PCT/CN2018/076640, filed Feb. 13, 2018, and claims priority from Chinese Application No. 201710434068.4, filed Jun. 9, 2017, the content of each of which is hereby incorporated by reference in its entirety.

TECHNICAL FIELD

The present disclosure relates to the field of display technology, and in particular, to an organic electroluminescent display panel and a method for manufacturing an organic electroluminescent display panel.

BACKGROUND

Organic light emitting diode (OLED) displays have characteristics such as self-luminescence, high brightness, wide viewing angle, high contrast, flexibility, low energy consumption and so on, thus have started to gradually replace traditional liquid crystal displays and are widely used for screens of mobile phones, displays of computers, full-color televisions or the like. The OLED display technology is different from the traditional liquid crystal display technology in that, the OLED display technology does not need a backlight, employs very thin coatings of organic material and glass substrates, and the organic material emits light when a current flows there-through. OLED displays have many advantages, including being capable of achieving a flexible display, for example, a flexible plastic substrate may be used as a carrier, and a thin film packaging process cooperates thereto to achieve a flexible OLED display panel.

SUMMARY

The present disclosure provides an organic electroluminescent display panel and a method for manufacturing an organic electroluminescent display panel.

The organic electroluminescent display panel includes: a substrate; a first electrode, a pixel defining layer, an organic light emitting functional layer and a second electrode which are provided on the substrate, the pixel defining layer being provided between any adjacent pixel regions and surrounding each of the pixel regions; a conductive layer and a protection layer which are provided at a side of the second electrode away from the substrate, the conductive layer being provided at a side of the pixel defining layer away from the substrate, the conductive layer and the protection layer being provided in a single layer, a surface of the protection layer away from the substrate being parallel to a surface of the second electrode away from the substrate, the conductive layer being provided between the protection layer and the second electrode, and the conductive layer is in contact with the second electrode, the protection layer including a first portion provided in the pixel regions and a second portion provided on the conductive layer, and in a direction perpendicular to the substrate, a sum of a thickness of the second portion and a thickness of the conductive layer being approximately equal to a thickness of the first portion.

In some implementations, an orthographic projection of the conductive layer on the substrate is within an orthographic projection of the pixel defining layer on the substrate.

In some implementations, an area of the conductive layer is less than or equal to an area of the pixel defining layer.

In some implementations, a material of the conductive layer includes a metal or a metal alloy, and a material of the protection layer includes an oxide of the metal or an oxide of the metal alloy.

In some implementations, the metal includes at least one of aluminum, zinc, tin, tantalum and titanium, and the oxide of the metal includes at least one of alumina, zinc oxide, tin dioxide, tantalic oxide and titanium oxide.

In some implementations, both the conductive layer and the pixel defining layer are of a grid structure.

In some implementations, the organic electroluminescent display panel further includes a buffer layer and a packaging layer, and the buffer layer and the packaging layer are provided above the protection layer successively.

In some implementations, the organic electroluminescent display panel further includes a switch transistor, a passivation layer and a planarization layer, the switch transistor, the passivation layer and the planarization layer are provided between the substrate and the first electrode, the passivation layer is located above the switch transistor, the planarization layer is located above the passivation layer, and the first electrode is connected to a drain of the switch transistor.

The method for manufacturing the organic electroluminescent display panel includes: forming a first electrode, a pixel defining layer, an organic light emitting functional layer and a second electrode on a substrate, the pixel defining layer being provided between any adjacent pixel regions and surrounding each of the pixel regions; forming a conductive film on the second electrode; performing an oxidation process on the conductive film to form a conductive layer and a protection layer, the conductive layer being provided at a side of the pixel defining layer away from the substrate, the conductive layer and the protection layer being provided in a single layer, a surface of the protection layer away from the substrate being parallel to a surface of the second electrode away from the substrate, the conductive layer being provided between the protection layer and the second electrode, and the conductive layer is in contact with the second electrode, the protection layer including a first portion provided in the pixel regions and a second portion provided on the conductive layer, and in a direction perpendicular to the substrate, a sum of a thickness of the second portion and a thickness of the conductive layer being approximately equal to a thickness of the first portion.

In some implementations, the performing the oxidation process on the conductive film to form the conductive layer and the protection layer includes: forming a mask pattern layer on the conductive layer, the mask pattern layer being located at the side of the pixel defining layer away from the substrate; performing a first oxidation process on the conductive film to form the first portion of the protection layer; and removing the mask pattern layer, and performing a second oxidation process on the conductive film to form the second portion of the protection layer and the conductive layer.

In some implementations, an oxidation intensity of the first oxidation process is larger than that of the second oxidation process.

In some implementation, the performing the first oxidation process on the conductive film includes: oxidizing the conductive film by annealing; or oxidizing the conductive film by a plasma oxidation process or an anode oxidation process.

In some implementations, a temperature for annealing ranges from 300° C. to 400° C., and a time for annealing ranges from 1 hour to 2 hours.

In some implementations, an area of the mask pattern layer is less than or equal to an area of the pixel defining layer.

In some implementations, the mask pattern layer includes photoresist.

In some implementations, the performing the oxidation process on the conductive film to form the conductive layer and the protection layer includes: forming a mask layer, a ratio of oxygen ions passing through a region of the mask layer corresponding to the pixel defining layer being less than a ratio of oxygen ions passing through a region of the mask layer corresponding to the pixel regions; performing the oxidation process on the conductive film to form the first portion of the protection layer in the pixel regions, the second portion of the protection layer in a region of the pixel defining layer, and the conductive layer.

In some implementations, the performing the oxidation process on the conductive film includes: employing a plasma oxidation process.

In some implementations, a material of the conductive layer includes at least one of aluminum, zinc, tin, tantalum and titanium, and a material of the protection layer includes at least one of alumina, zinc oxide, tin dioxide, tantalic oxide and titanium oxide.

In some implementations, the method for manufacturing the organic electroluminescent display panel further includes: forming a buffer layer and a packaging layer above the protection layer successively.

In some implementations, the method for manufacturing the organic electroluminescent display panel further includes: before forming the first electrode above the substrate, forming a switch transistor, a passivation layer and a planarization layer successively on the substrate, and the first electrode is connected to a drain of the switch transistor.

DESCRIPTION OF DRAWINGS

Embodiments of the present disclosure will be described below in conjunction with accompanying drawings, but the present disclosure is not limited by the embodiments shown in the accompanying drawings.

DESCRIPTION OF EMBODIMENTS

In order to make a person skilled in the art understand technical solutions of the present disclosure better, the organic electroluminescent display panel and the method for manufacturing the organic electroluminescent display panel provided by the present disclosure will be further described in detail below in conjunction with the accompanying drawings and specific implementations.

For a top-emitting active-matrix organic light emitting diode (AMOLED) display, a cathode therein has a crucial influence on its performance. The cathode should possess a good light transmittance and a high conductivity. With a traditional cathode material, the cathode could have a good light transmittance only when it has a very thin thickness, but in a case where the cathode is very thin, there is often a risk of breaking off or forming an ohmic contact, resulting in an increasing of power consumption. In addition, in a case where the cathode has a thin thickness, the AMOLED display may display with an uneven brightness. Thus, the cathode of the top-emitting AMOLED display should be designed by considering the light transmittance and the conductivity simultaneously. In order to reduce the power consumption, a traditional improvement for the cathode is employing a metal material (e.g., metal sliver) having a high conductivity to uniformly coat a metal film during a coating process so as to form the cathode, and a thickness of the metal film is adjusted to balance the conductivity and the light transmittance of the cathode. In such way, in a case where the light transmittance of the cathode is satisfied, the conductivity of the cathode is still poor, resulting in high power consumption.

Thus, a technical problem to be solved urgently is how to ensure the light transmittance and the conductivity of the cathode simultaneously without increasing steps for manufacturing an OLED device.

An embodiment of the present disclosure provides a method for manufacturing an organic electroluminescent display panel. The organic electroluminescent display panel includes: a substrate; a first electrode, a pixel defining layer, an organic light emitting functional layer and a second electrode which are provided on the substrate, the pixel defining layer being provided between any adjacent pixel regions and surrounding each of the pixel regions; a conductive layer and a protection layer which are provided at a side of the second electrode away from the substrate, the conductive layer being provided at a side of the pixel defining layer away from the substrate, the conductive layer and the protection layer being provided in a single layer, a surface of the protection layer away from the substrate being parallel to a surface of the second electrode away from the substrate, the conductive layer being provided between the protection layer and the second electrode, and the conductive layer is in contact with the second electrode, the protection layer including a first portion provided in the pixel regions and a second portion provided on the conductive layer, and in a direction perpendicular to the substrate, a sum of a thickness of the second portion and a thickness of the conductive layer being approximately equal to a thickness of the first portion.

The method for manufacturing the organic electroluminescent display panel will be described below by taking the first electrode being an anode and the second electrode being a cathode as an example.

Referring to FIGS. 1 through 6 and FIG. 9, the method for manufacturing the organic electroluminescent display panel includes: step S100, forming an anode 2, a pixel defining layer 3, an organic light emitting functional layer 4 and a cathode 5 successively on a substrate 1, the organic light emitting functional layer 4 is divided into a plurality of portions by the pixel defining layer 3, each portion of the organic light emitting functional layer 4, the anode below each portion of the organic light emitting functional layer 4 and the cathode above each portion of the organic light emitting functional layer 4 constitute a light emitting element, a region where each light emitting element is located is a pixel region, the pixel defining layer 3 is provided between any adjacent pixel regions and surrounds each of the pixel regions; forming a conductive film 11 on the cathode 5 and performing an oxidation process on the conductive film 11 to form a conductive layer 7 and a protection layer 6, wherein the conductive layer 7 is formed in a region corresponding to the pixel defining layer 3, embedded in the protection layer 6, and in contact with the cathode 5, that is, the conductive layer 7 directly contacts the cathode 5 and is electrically connected to the cathode 5.

Figure 5:
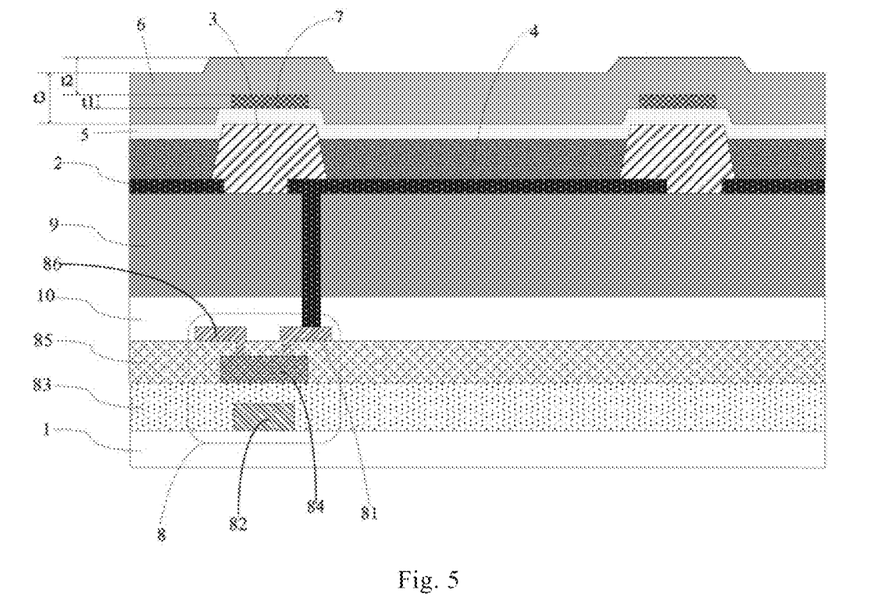
FIG. 5 shows a sectional view of a structure, in which a conductive layer is formed by removing the mask pattern layer and performing a second oxidation process on the conductive film, in an embodiment of the present disclosure.
Figure 6:
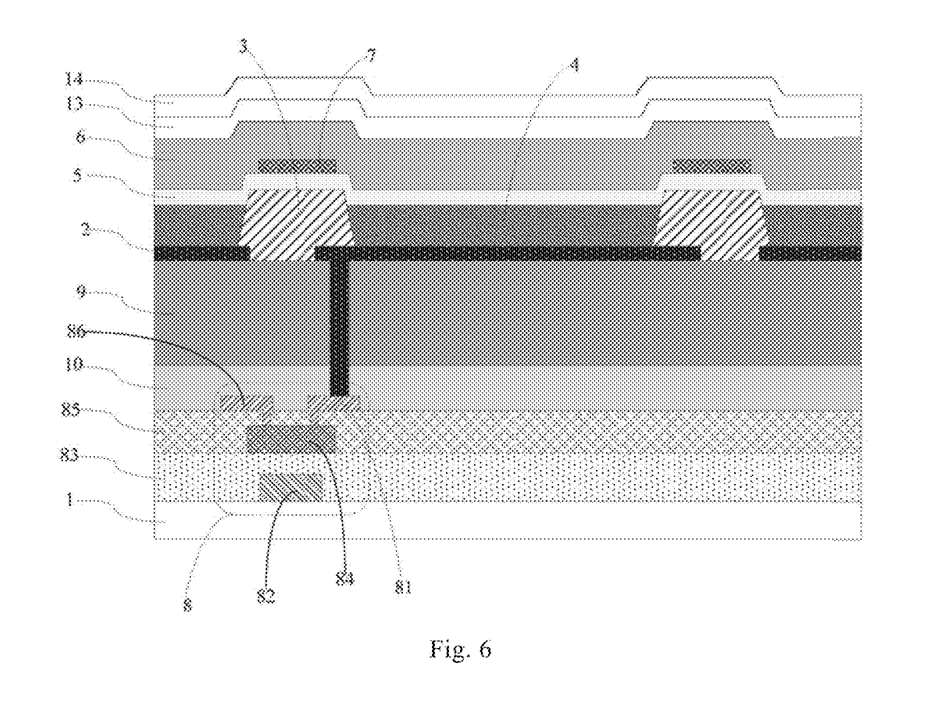
FIG. 6 shows a sectional view of a structure, in which a buffer layer and a packaging layer are formed on a protection layer, in an embodiment of the present disclosure.

As shown in FIGS. 5 and 6, the conductive layer 7 is provided at a side of the pixel defining layer 3 away from the substrate 1, the conductive layer 7 and the protection layer 6 are provided in a single layer, a surface of the protection layer 6 away from the substrate 1 is parallel to a surface of the cathode 5 away from the substrate 1, the conductive layer 7 is provided between the protection layer 6 and the cathode 5, and the conductive layer is in contact with the cathode 5, the protection layer 6 includes a first portion provided in the pixel regions and a second portion provided on the conductive layer 7, and in a direction perpendicular to the substrate, a sum of a thickness t2 of the second portion and a thickness t1 of the conductive layer is approximately equal to a thickness t3 of the first portion.

In the embodiment, each of the pixel regions may correspond to a sub-pixel of a pixel.

Since the conductive layer 7 is in contact with the cathode 5, a resistance of the cathode 5 is reduced, and the cathode 5 with a thin thickness and a light transmittance is prevented from breaking off or forming an ohmic contact, thus the conductivity of the cathode 5 is improved while a good light transmittance of the cathode 5 is ensured, and uniformity of display of the organic electroluminescent display panel is improved. Since the conductive layer 7 and the protection layer 6 are formed simultaneously, steps for manufacturing the organic electroluminescent display panel are not increased. Since the conductive layer 7 is provided in the region where the pixel defining layer 3 is located, an aperture ratio of the organic electroluminescent display panel is not affected.

Figure 1:
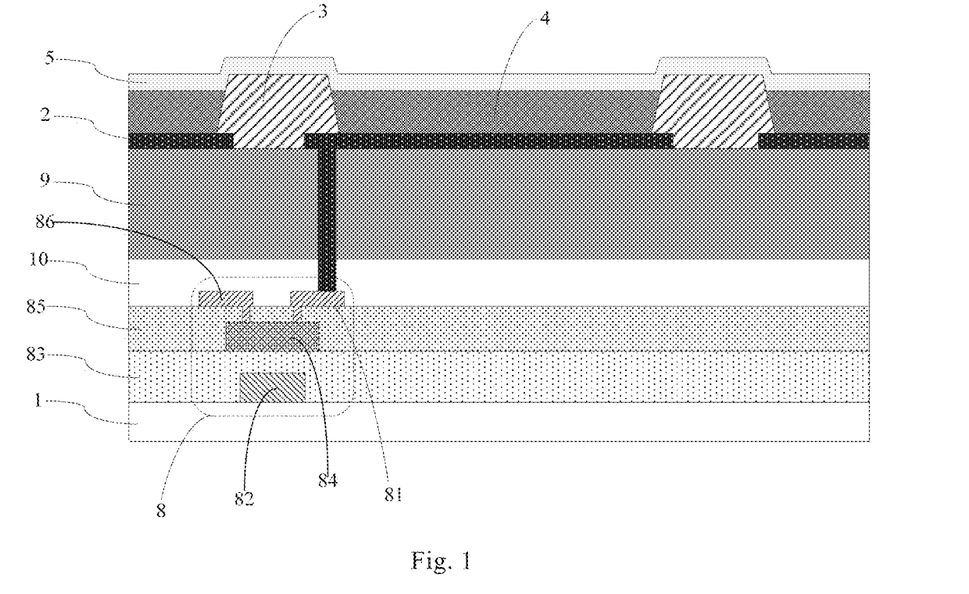
FIG. 1 shows a sectional view of a structure, in which an anode, a pixel defining layer, an organic light emitting functional layer and a cathode are formed on a substrate, in an embodiment of the present disclosure.

The method for manufacturing the organic electroluminescent display panel further includes: step S099, before forming the anode 2 on the substrate 1, forming a switch transistor 8, a passivation layer 10 and a planarization layer 9 successively on the substrate 1, and the anode 2 is connected to a drain 81 of the switch transistor 81, as shown in FIG. 1. The forming the switch transistor 8 on the substrate 1 includes: forming a gate 82, a gate insulation layer 83, an active layer 84, an etch stop layer 85, a source 86 and a drain 81 successively on the substrate 1 by traditional patterning processes, which will not be described in detail here. Then, the passivation layer 10 and the planarization layer 9 are formed on the substrate 1, on which the switch transistor 8 has been formed, by traditional patterning processes. Since there is a height difference between layers before the planarization layer 9 is formed, and the anode 2, the cathode 5 and the organic light emitting functional layer 4 of the OLED device to be formed subsequently should be formed on a relatively flat surface, the planarization layer 9 is required to be formed on the passivation layer 10. In addition, the planarization layer 9 enables an OLED array substrate to be formed to be flat, which facilitates packaging for the OLED array substrate. The planarization layer 9 may be formed of any insulation material having a good light transmittance, such as resin, and a thickness of the planarization layer 9 formed of resin may range from 2 μm to 20 μm.

In the embodiment, the anode 2, the pixel defining layer 3, the organic light emitting functional layer 4 and the cathode 5 capable of light transmitting are formed successively on the substrate 1, on which the switch transistor 8, the passivation layer 10 and the planarization layer 9 have been formed, by traditional patterning processes, which will not be described in detail here. The pixel defining layer 3 is provided on the planarization layer 9, located between any adjacent pixel regions, surrounds each of the pixel regions and may be formed of polyimide material by a photolithography or printing technology. The pixel defining layer 3 is configured to separate the adjacent pixel regions, and simultaneously cover the planarization layer 9 and edges of each anode 2 provided in a single layer, a center part of each anode 2 is exposed, that is, the pixel defining layer 3 and a region corresponding to the center part of each anode 2 together form a structure similar to a recess (i.e., an aperture region of the organic electroluminescent display panel), the organic light emitting functional layer 4 (i.e., sub-pixels of three colors including red, green and blue, a region where each sub-pixel is located is referred to as a pixel region) may be formed on the center part of the anode 2 by an evaporation process. The organic light emitting functional layer 4 includes a hole injection layer, a hole transport layer, a light emitting layer, an electronic transport layer, an electronic injection layer and so on. The cathode 5 formed of a metal covers the organic light emitting functional layer 4. Due to its thin thickness, the cathode 5 is capable of transmitting light.

It should be noted that, only an example of arrangement of various layers in the OLED array substrate are illustrated in the embodiment, but the present disclosure is not limited thereto.

In the embodiment, the step of forming the conductive film 11 on the cathode 5 and performing the oxidation process on the conductive film 11 to form the protection layer 6 and the conductive layer 7 includes following steps S101 through S104.

Figure 2:
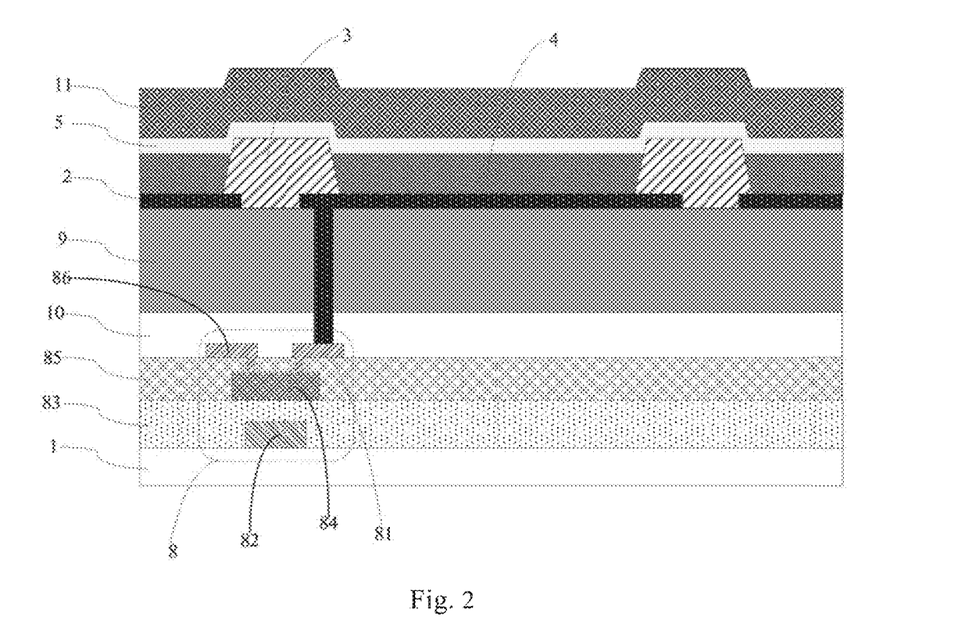
FIG. 2 shows a sectional view of a structure, in which a conductive film is formed on the substrate, in an embodiment of the present disclosure.

At step S101, the conductive layer 11 is formed on the cathode 5, as shown in FIG. 2.

At this step, for example, a metal film (e.g., an aluminum film) grows on a surface of the cathode 5 by a magnetron sputtering method. Certainly, a material of the metal film may also include zinc, tin, tantalum, titanium or the like.

Figure 3:
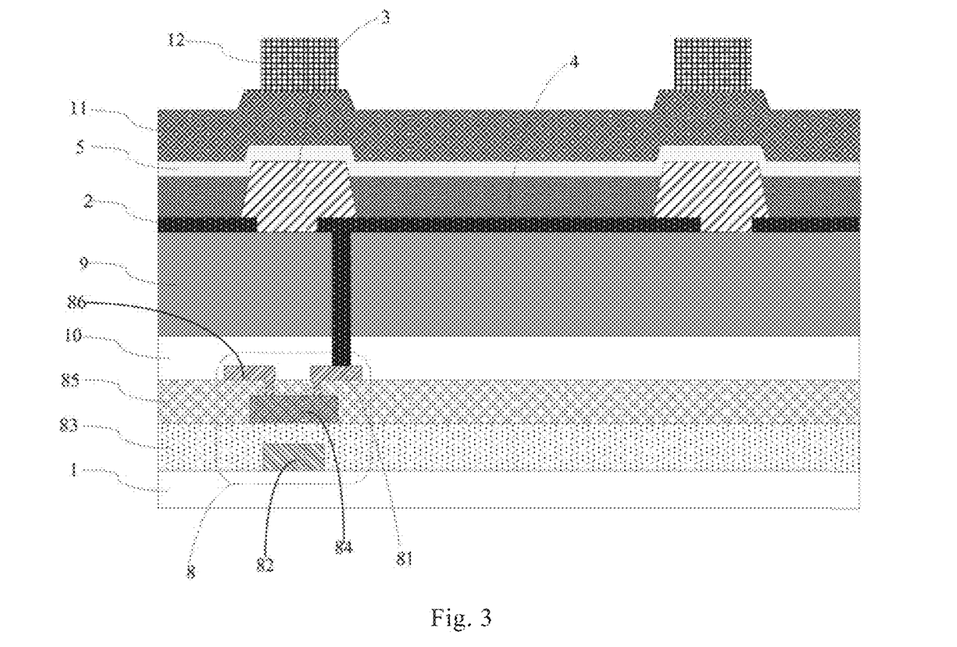
FIG. 3 shows a sectional view of a structure, in which a mask pattern layer is formed on a region of the pixel defining layer on the substrate, in an embodiment of the present disclosure.

At step S102, a mask pattern layer (e.g., a photoresist pattern layer) 12 is formed on the conductive layer 11. The mask pattern layer 12 is formed at a side of the pixel defining layer 3 away from the substrate 1, as shown in FIG. 3.

At this step, the mask pattern layer 12 is formed by coating, exposing and developing, and is located right above the pixel defining layer 3. The area of the mask pattern layer 12 is less than or equal to an area of the pixel defining layer 3. With such arrangement, an orthographic projection of the conductive layer 7 to be formed subsequently on the substrate 1 will located within an orthographic projection of the pixel defining layer 3 on the substrate 1. In some implementations, an area of the conductive layer 7 is less than or equal to the area of the pixel defining layer 3, so that the conductive layer 7 will not affect an aperture ratio of pixel regions of the organic electroluminescent display panel.

Figure 4:
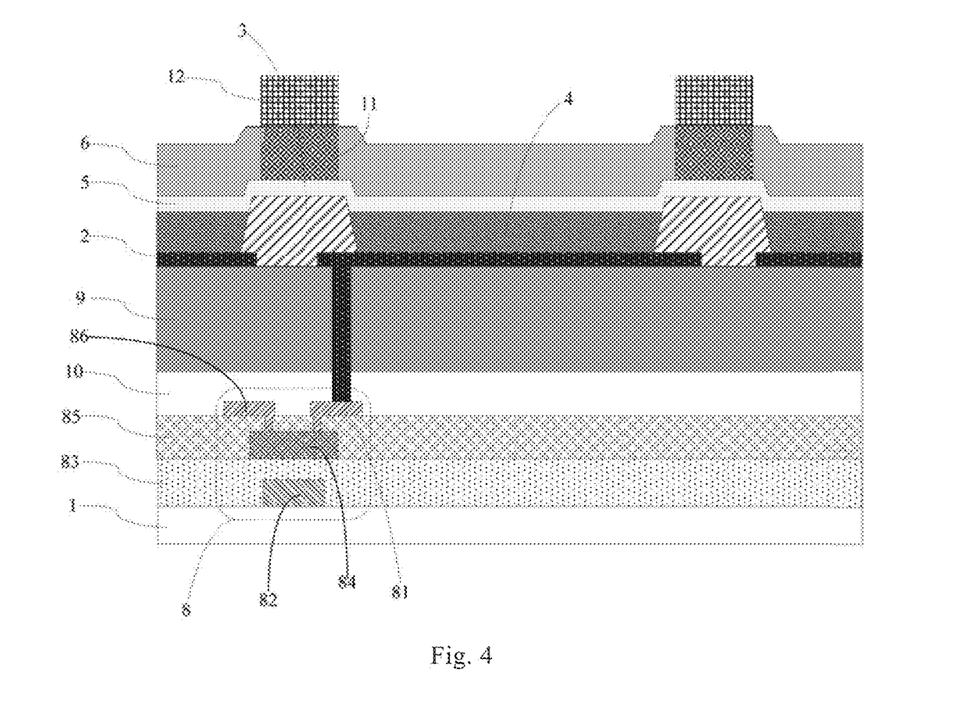
FIG. 4 shows a sectional view of a structure, in which the conductive film not covered by the mask pattern layer has been subjected to a first oxidation process, in an embodiment of the present disclosure.

At step S103, a first oxidation process is performed on the conductive film 11 to form a first portion of the protection layer 6, as shown in FIG. 4.

At this step, the step of performing the first oxidation process on the conductive film 11 incudes: oxidizing the conductive film 11 by annealing. By controlling a time and a temperature for annealing, for example, the temperature for annealing is controlled to be in a range from 300° C. to 400° C., and the time for annealing is controlled to be in a range from 1 hour to 2 hours, a portion of the conductive film 11 not covered by the mask pattern layer 12 will be oxidized completely to form the first portion of the protection layer 6. For example, in a case where the conductive film 11 is an aluminum film, a transparent alumina film will be formed by oxidizing the aluminum film. Alumina is a new wide band gap semiconductor material of group III-VI, and the alumina film has a high transparency, a low absorption, and good physical and chemical properties in a light spectrum range from ultraviolet spectrum to mid-far infrared spectrum, thus is the most commonly used optical material with medium refractive index. By controlling a quality of film, the alumina film may have a very small absorptivity of light, and a very high light transmittance. The oxidation process described above for oxidizing the conductive film 11 is also suitable for a metal such as zinc, tin, tantalum or titanium, the protection layer 6 is correspondingly formed of zinc oxide, tin dioxide, tantalic oxide or titanium oxide.

In some implementations, at this step, the conductive film 11 may also be oxidized by a plasma oxidation process or an anode oxidation process. For example, the plasma oxidation process is to process the conductive film 11 (e.g., an aluminum film) on an array substrate by using $O_2$ under a plasma state, the aluminum film is oxidized as an alumina ($Al_2O_3$) film (a portion of the protection layer 6). The anode oxidation process is to employ aluminum as an anode, employ graphite or platinum as a cathode, connect a power supply with a constant voltage or a constant current between the anode and the cathode, dip the anode and the cathode in an electrolyte solution which is a weak acid or weak base solution such as citric acid and ammonium tartrate solution, and electrify the anode and the cathode. By electrifying the anode and the cathode, an electrochemical reaction occurs at the anode, i.e., $2Al+3H_2O \rightarrow Al_2O_3+6e+6H^+$, an electrochemical reaction occurs at the cathode, i.e., $6H_2O+6e \rightarrow 3H_2+6OH^-$. That is, the reaction occurred at the anode is an oxidation reaction of metal, can be performed at a room temperature on a flexible substrate which could not endure a high temperature, thus is suitable for manufacturing a flexible display device, and simultaneously, no expensive equipment for a high temperature process such as chemical vapor deposition is required, resulting in greatly reducing of cost. The oxidation process described above for oxidizing the conductive film 11 is also suitable for a metal such as zinc, tin, tantalum or titanium, the protection layer 6 is correspondingly formed of zinc oxide, tin dioxide, tantalic oxide or titanium oxide.

At step S104, the mask pattern layer 12 is removed, a second oxidation process is performed on the conductive film 11 to form a second portion of the protection layer 6 and the conductive layer 7, as shown in FIG. 5.

At this step, the mask pattern layer 12 is stripped off, the second oxidation process is performed on a portion of the conductive film 11 proximal to an upper surface thereof by using a method for oxidizing the conductive film 11 in step S103 again, for example, by controlling the time and the temperature for annealing, the temperature for annealing is controlled to be in a range from 300° C. to 400° C., and the time for annealing is controlled to be 0.5 hour, a top layer of a portion of the conductive layer 11 previously covered by the mask pattern layer 12 is oxidized to form the second portion of the protection layer 6, and a bottom layer of the portion of the conductive layer 11 previously covered by the mask pattern layer 12 is not oxidized, thus forms the conductive layer 7 to be electrically connected to the cathode 5. The conductive layer 7 is embedded in the transparent protection layer 6, and the protection layer 6 includes the first portion provided in the pixel regions and the second portion provided on the conductive layer 7, and in a direction perpendicular to the substrate 1, a sum of a thickness t2 of the second portion of the protection layer 6 and a thickness t1 of the conductive layer 7 is approximately equal to a thickness t3 of the first portion of the protection layer 6. In the embodiment, the conductive film 11 may be an aluminum film, a top layer of a portion of the aluminum film previously covered by the mask pattern layer 12 is oxidized to form the second portion of the protection layer, and a bottom layer of the portion of the aluminum film previously covered by the mask pattern layer 12 is not oxidized, thus forms an aluminum conductive layer in a grid structure, which will be electrically connected to the cathode 5. The aluminum conductive layer is embedded in the transparent alumina film, and in the direction perpendicular to the substrate, a sum of the thickness of the second portion of the protection layer and the thickness of the aluminum conductive layer is approximately equal to the thickness of the first portion of the protection layer, resulting in that a height difference at a surface of the organic electroluminescent display panel will not be increased additionally.

At this step, since the bottom layer of the conductive film 11 proximal to the cathode 5 is not required to be oxidized, an oxidation intensity of the second oxidation process should be appropriately less than an oxidation intensity of the first oxidation process in the step S103, so that the bottom layer of the conductive film 11 proximal to the cathode 5 is not oxidized and electrically in contact with the cathode 5. The oxidation intensity generally refers to a concentration of oxygen ions. In the embodiment, for example, the oxidation intensity is generally adjusted by adjusting the temperature or the time for annealing.

Only an example of the method for manufacturing the organic electroluminescent display panel is illustrated in the embodiment, but the present disclosure is not limited to a sequence of steps described above, the steps described above may be performed in any other order.

Figure 10:
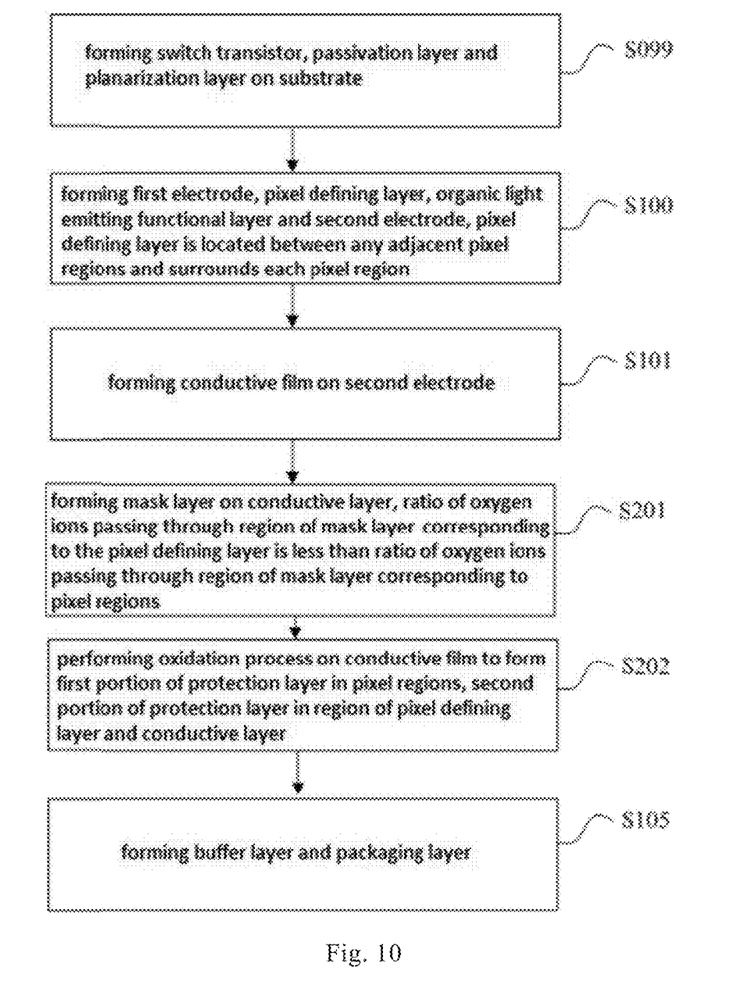
FIG. 10 shows a flow chart of a method for manufacturing an organic electroluminescent display panel in an embodiment of the present disclosure.

According to another embodiment of the present disclosure, as shown in FIG. 10, the step of oxidizing the conductive film 11 to form the protection layer 6 and the conductive layer 7 may include following steps S201 and S202.

Figure 7:
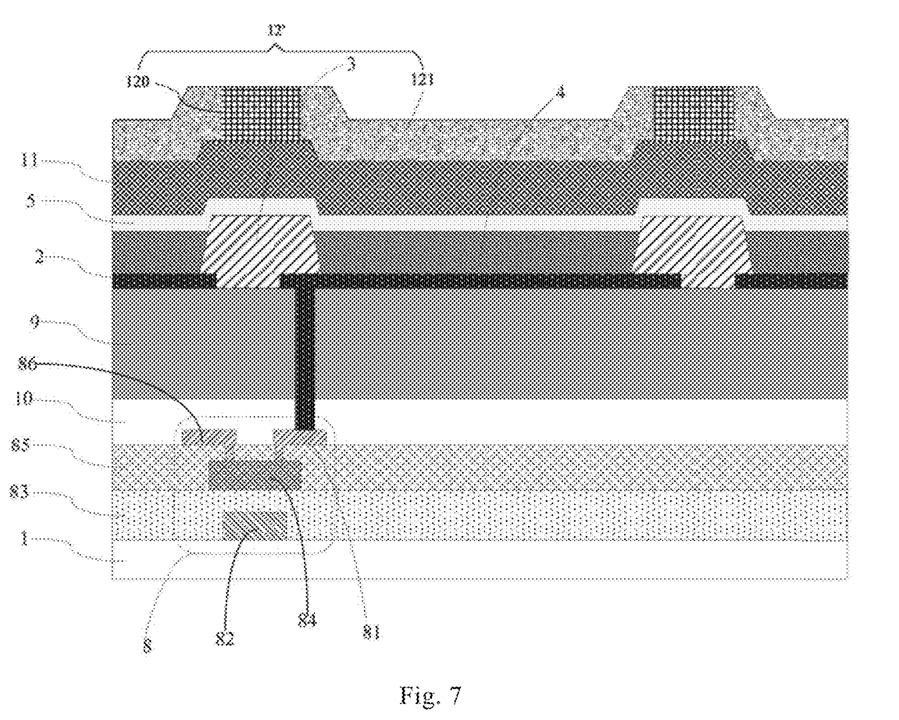
FIG. 7 shows a sectional view of a structure, in which a mask layer is formed over an entire of the substrate, in an embodiment of the present disclosure.

At step S201, a mask layer 12' is formed on the conductive film 11, a ratio of oxygen ions passing through a region of the mask layer 12' corresponding to the pixel defining layer (i.e., the ratio of oxygen ions passing through a first mask portion 121) is less than a ratio of oxygen ions passing through a region of the mask layer 12' corresponding to the pixel regions (i.e., the ratio of oxygen ions passing through a second mask portion 120), as shown in FIG. 7.

At step S202, an oxidation process is performed on the conductive film 11 to form the first portion of the protection layer in the pixel regions (corresponding to a region in which the first mask portion 121 is located), the second portion of the protection layer in a region of the pixel defining layer (corresponding to a region in which the second mask portion 120 is located), and the conductive layer 7, as shown in FIG. 5.

In the present embodiment, the oxidation process may be performed by a plasma oxidation process.

In the present embodiment, the mask layer 12' is formed over an entire of the conductive film 11, the ratio of oxygen ions passing through a region of the mask layer 12' corresponding to the pixel regions is different from the ratio of oxygen ions passing through a region of the mask layer 12' corresponding to the pixel defining layer, thus a single oxidation process (e.g., a plasma oxidation process) is performed on the conductive film 11 to form the conductive layer and the protection layer including the first portion provided in the pixel regions and the second portion provided corresponding to the pixel defining layer, which is different from that the mask pattern layer is formed on the conductive film 11 and two oxidation processes are formed in the previous embodiment.

The mask layer 12' may be a mask plate with different transmittances in different regions.

Other features of the present embodiment are similar to those in the previous embodiment, thus will not be repeatedly described here.

Figure 9:
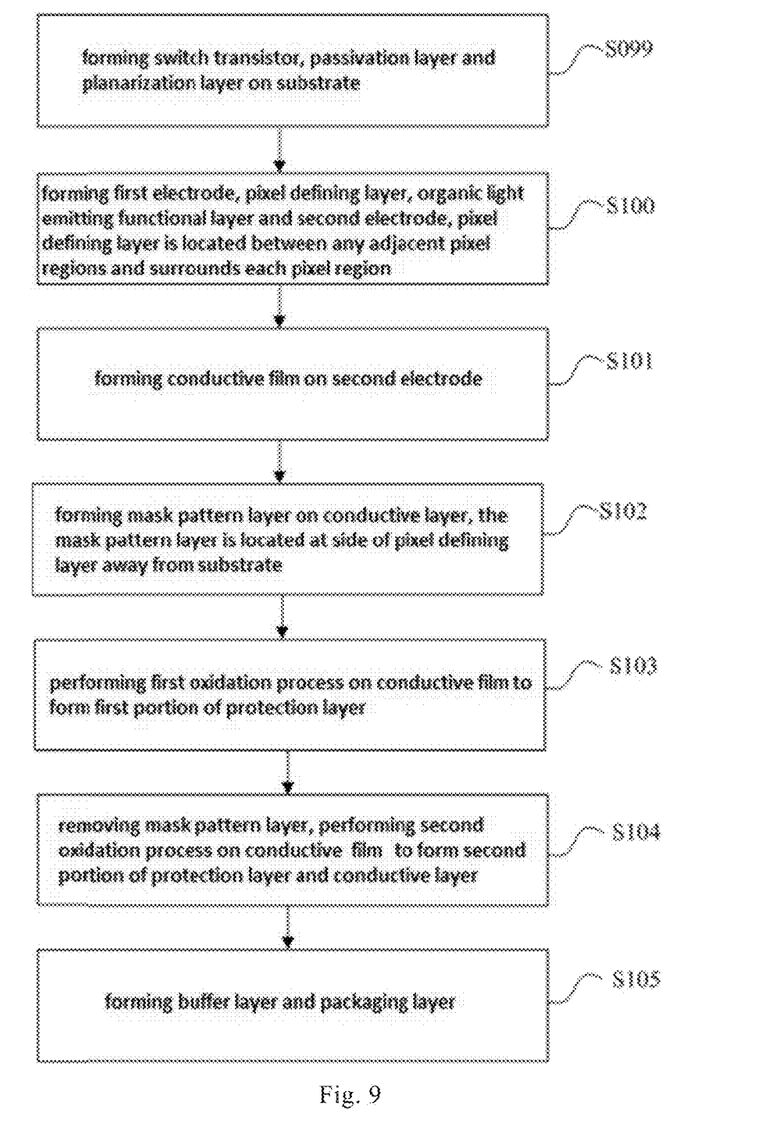
FIG. 9 shows a flow chart of a method for manufacturing an organic electroluminescent display panel in an embodiment of the present disclosure.

In the embodiment of the present disclosure, the method for manufacturing the organic electroluminescent display panel may further include: step S105, forming a buffer layer 13 and a packaging layer 14 above the protection layer 6, as shown in FIGS. 6 and 9.

A material of the buffer layer 13 generally includes an organic material, such as polyethylene terephthalate, polyethylene naphthalate, polycarbonate, polyimide, polyvinyl chloride, polystyrene, polymethyl methacrylate, polybutylene terephthalate, polysulfone, polyethylene terephthalate, polyethylene, polypropylene, polyamide, polytetrafluoroethylene or epoxy resin. A material of the packaging layer 14 may include silicon nitride. Silicon nitride has good barrier properties for water and oxygen.

The buffer layer 13 and the packaging layer 14 are formed by traditional patterning processes, which will not be described in detail here.

In the method for manufacturing the organic electroluminescent display panel provided by the embodiment of the present disclosure, the conductive layer is formed to be in direct electrical contact with the cathode, a resistance of the cathode is reduced, and the cathode with a thin thickness and a light transmittance is prevented from breaking off or forming an ohmic contact, the conductivity of the cathode is improved while a good light transmittance of the cathode is ensured, and uniformity of display of the organic electroluminescent display panel is improved. Since the conductive layer and the protection layer are formed simultaneously, steps for manufacturing the organic electroluminescent display panel are not increased. Since the conductive layer is provided in the region where the pixel defining layer is located, an aperture ratio of the organic electroluminescent display panel is not affected, and a height difference at a surface of the organic electroluminescent display panel is not increased additionally.

Based on the method for manufacturing the organic electroluminescent display panel provided by the embodiment of the present disclosure, an organic electroluminescent display panel manufactured by the method of the embodiment of the present disclosure is provided. As shown in FIGS. 5 and 6, the organic electroluminescent display panel includes: a substrate 1; an anode 2, a pixel defining layer 3, an organic light emitting functional layer 4 and a cathode 5 which are provided on the substrate 1, the organic light emitting functional layer 4 is divided into a plurality of portions by the pixel defining layer 3, each portion of the organic light emitting functional layer 4, the anode below each portion of the organic light emitting functional layer 4 and the cathode above each portion of the organic light emitting functional layer 4 constitute a light emitting element, a region where each light emitting element is located is a pixel region, the pixel defining layer 3 is provided between any adjacent pixel regions and surrounds each of the pixel regions; a conductive layer 7 and a protection layer 6 provided at a side of the cathode 5 away from the substrate 1, the conductive layer 7 is formed at a side of the pixel defining layer 3 away from the substrate 1, the conductive layer 7 and the protection layer 6 are provided in a single layer, a surface of the protection layer 6 away from the substrate 1 is parallel to a surface of the cathode 5 away from the substrate 1, the conductive layer 7 is provided between the protection layer 6 and the cathode 5, is in direct contact with the cathode 5 and electrically connected with the cathode 5, the protection layer 6 includes a first portion provided in the pixel regions and a second portion provided on the conductive layer 7, and in a direction perpendicular to the substrate, a sum of a thickness t2 of the second portion of the protection layer 6 and a thickness t1 of the conductive layer 7 is approximately equal to a thickness t3 of the first portion of the protection layer 6, as shown in FIG. 5.

An orthographic projection of the conductive layer 7 on the substrate 1 is within an orthographic projection of the pixel defining layer 3 on the substrate 1. For example, an area of the conductive layer 7 is less than or equal to an area of the pixel defining layer 3.

A material of the conductive layer 7 may include a metal or a metal alloy, and a material of the protection layer 6 may include an oxide of the metal or an oxide of the metal alloy.

For example, the metal may include at least one of aluminum, zinc, tin, tantalum and titanium, and correspondingly, the oxide of the metal includes at least one of alumina, zinc oxide, tin dioxide, tantalic oxide and titanium oxide.

Both the conductive layer and the pixel defining layer are of a grid structure.

The protection layer 6 can ensure a good package of the organic electroluminescent display panel. By contacting the conductive layer 7 with the cathode 5, a resistance of the cathode 5 is reduced, and the cathode 5 with a thin thickness and a light transmittance is prevented from breaking off or forming an ohmic contact, the conductivity of the cathode 5 is improved while a good light transmittance of the cathode 5 is ensured, and uniformity of display of the organic electroluminescent display panel is improved. Since the conductive layer 7 is provided in the region where the pixel defining layer 3 is located, an aperture ratio of the organic electroluminescent display panel is not affected, and since the conductive layer 7 is embedded in the protection layer 6, in a direction perpendicular to the substrate, a sum of a thickness t2 of the second portion of the protection layer 6 and a thickness t1 of the conductive layer 7 is approximately equal to a thickness t3 of the first portion of the protection layer 6, as shown in FIG. 5, a height difference at a surface of the organic electroluminescent display panel is not increased additionally.

In the embodiment, an area of the conductive layer 7 is less than or equal to an area of the pixel defining layer 3. With such arrangement, the conductive layer 7 will not occupy an aperture area of the pixel regions, thus the conductive layer 7 will not affect an aperture ratio of the organic electroluminescent display panel.

Additionally, in the embodiment, the organic electroluminescent display panel further includes a switch transistor 8, a passivation layer 10 and a planarization layer 9, the switch transistor 8, the passivation layer 10 and the planarization layer 9 are provided between the substrate 1 and the anode 2, the passivation layer 10 is provided above the switch transistor 8, the planarization layer 9 is provided above the passivation layer 10, and the anode 2 is connected to a drain 81 of the switch transistor 8. The switch transistor 8 includes a gate 82, a gate insulation layer 83, an active layer 84, an etch stop layer 85, a source 86 and a drain 81 successively formed on the substrate 1. The passivation layer 10 and the planarization layer 9 are successively formed above the source 86 and the drain 81. The anode 2 is connected to the drain 81 through a via-hole formed in the passivation layer 10 and the planarization layer 9. The planarization layer 9 enables the organic light emitting functional layer 4 to be formed on a relatively flat surface, and simultaneously enables the organic electroluminescent display panel to be flat, which facilitates packaging for the organic electroluminescent display panel.

Figure 8:
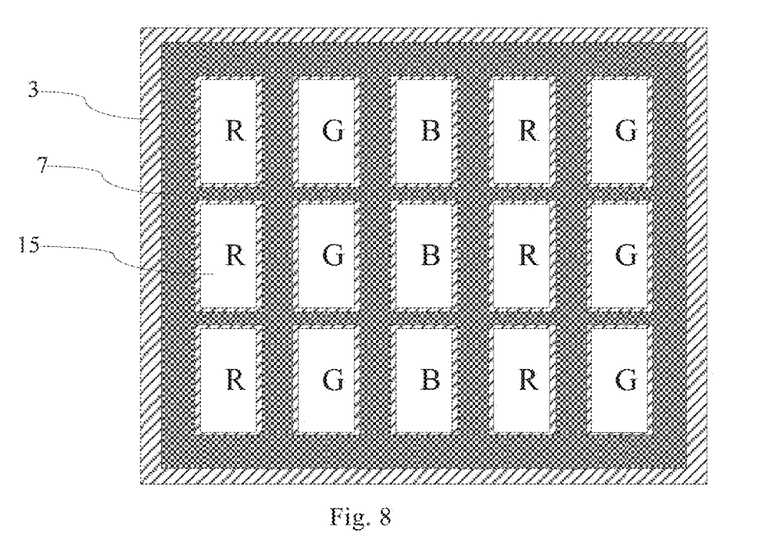
FIG. 8 shows a top view of a structure of an organic electroluminescent display panel in an embodiment of the present disclosure.

In the embodiment, as shown in FIG. 8, the pixel defining layer 3 is provided on the planarization layer 9, located between any adjacent pixel regions 15, surrounds each of the pixel regions 15, and is configured to separate the adjacent pixel regions 15, and simultaneously cover the planarization layer 9 and edges of each anode 2 provided in a single layer, a center part of each anode 2 is exposed, that is, the pixel defining layer 3 and a region corresponding to the center part of each anode 2 together form a structure similar to a recess (i.e., an aperture region of the organic electroluminescent display panel), the organic light emitting functional layer 4 (i.e., sub-pixels of three colors including red, green and blue, a region where each sub-pixel is located is referred to as a pixel region) is formed on the center part of the anode 2. The organic light emitting functional layer 4 includes a hole injection layer, a hole transport layer, a light emitting layer, an electronic transport layer, an electronic injection layer and so on. The transparent cathode 5 covers the organic light emitting functional layer 4. Due to its thin thickness, the cathode 5 is capable of transmitting light.

In the embodiment, the organic electroluminescent display panel may further include a buffer layer 13 and a packaging layer 14. The buffer layer 13 and the packaging layer 14 are provided above the protection layer 6 successively. The buffer layer 13 is generally formed of organic material, and the packaging layer 14 is formed of silicon nitride material. The buffer layer 13 and the packaging layer 14 form a further protection package for the OLED device, and prevent water and oxygen from entering into the OLED device.

The protection layer can ensure a good package of the organic electroluminescent display panel. By contacting the conductive layer with the cathode, a resistance of the cathode is reduced, and the cathode with a thin thickness and a light transmittance is prevented from breaking off or forming an ohmic contact, the conductivity of the cathode is improved while a good light transmittance of the cathode is ensured, and uniformity of display of the organic electroluminescent display panel is improved. Since the conductive layer is provided in the region where the pixel defining layer is located, an aperture ratio of the organic electroluminescent display panel is not affected, and since the conductive layer is embedded in the protection layer, a height difference at a surface of the organic electroluminescent display panel is not increased additionally.

The organic electroluminescent display panel provided by the embodiment of the present disclosure may be any product or member having a display function, such as an organic electroluminescent television, a display, a mobile phone, a navigator and so on.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. A method for manufacturing an organic electroluminescent display panel, comprising:
    forming a first electrode, a pixel defining layer, an organic light emitting functional layer and a second electrode on a substrate, the pixel defining layer being provided between any adjacent pixel regions and surrounding each of the pixel regions;
    forming a conductive film on the second electrode; and
    performing an oxidation process on the conductive film to form a conductive layer and a protection layer, wherein the conductive layer is provided at a side of the pixel defining layer away from the substrate, the conductive layer and the protection layer are provided in a single layer, a surface of the protection layer away from the substrate is parallel to a surface of the second electrode away from the substrate, the conductive layer is provided between the protection layer and the second electrode, and the conductive layer is in contact with the second electrode, the protection layer comprises a first portion provided in the pixel regions and a second portion provided on the conductive layer, and in a direction perpendicular to the substrate, a sum of a thickness of the second portion and a thickness of the conductive layer is approximately equal to a thickness of the first portion,
    wherein a material of the conductive layer includes a metal or a metal alloy, and a material of the protection layer includes an oxide of the metal or an oxide of the metal alloy,
    wherein the performing the oxidation process on the conductive film to form the conductive layer and the protection layer comprises:
    forming a mask pattern layer on the conductive film, the mask pattern layer being located at the side of the pixel defining layer away from the substrate;
    performing a first oxidation process on the conductive film to form the first portion of the protection layer; and removing the mask pattern layer, and performing a second oxidation process on the conductive film to form the second portion of the protection layer and the conductive layer, and wherein an oxidation intensity of the first oxidation process is larger than that of the second oxidation process.

2. The method of claim 1, wherein the performing the first oxidation process on the conductive film comprises:

oxidizing the conductive film by annealing; or oxidizing the conductive film by a plasma oxidation process or an anode oxidation process.

3. The method of claim 1, wherein an area of the mask pattern layer is less than or equal to an area of the pixel defining layer.

4. The method of claim 1, wherein the mask pattern layer includes photoresist.

5. The method of claim 1, wherein the metal includes at least one of aluminum, zinc, tin, tantalum and titanium, and the oxide of the metal includes at least one of alumina, zinc oxide, tin dioxide, tantalic oxide, and titanium oxide.

6. The method of claim 1, further comprises:

forming a buffer layer and a packaging layer above the protection layer successively.

7. The method of claim 1, further comprises:

before forming the first electrode above the substrate, forming a switch transistor, a passivation layer, and a planarization layer successively on the substrate, and the first electrode is connected to a drain of the switch transistor.

8. A method for manufacturing an organic electroluminescent display panel, comprising:

forming a first electrode, a pixel defining layer, an organic light emitting functional layer and a second electrode on a substrate, the pixel defining layer being provided between any adjacent pixel regions and surrounding each of the pixel regions;

forming a conductive film on the second electrode; and performing an oxidation process on the conductive film to form a conductive layer and a protection layer, wherein the conductive layer is provided at a side of the pixel defining layer away from the substrate, the conducive layer and the protection layer are provided in a single layer, a surface of the protection layer away from the substrate is parallel to a surface of the second electrode away from the substrate, the conductive layer is provided between the protection layer and the second electrode, and the conductive layer is in contact with the second electrode, the protection layer comprises a first portion provided in the pixel regions and a second portion provided on the conductive layer, and in a direction perpendicular to the substrate, a sum of a thickness of the second portion and a thickness of the conductive layer is approximately equal to a thickness of the first portion, wherein a material of the conductive layer includes a metal or a metal alloy, and a material of the protection layer includes an oxide of the metal or an oxide of the metal alloy, wherein the performing the oxidation process on the conductive film to form the conductive layer and the protection layer comprises:

forming a mask layer, a ratio of oxygen ions passing through a region of the mask layer corresponding to the pixel defining layer being less than a ratio of oxygen ions passing through a region of the mask layer corresponding to the pixel regions; and performing the oxidation process on the conductive film to form the first portion of the protection layer in the pixel regions, the second portion of the protection layer in a region of the pixel defining layer, and the conductive layer.

9. The method of claim 8, wherein the performing the oxidation process on the conductive film comprises:

employing a plasma oxidation process.

* * * * *